US012124143B2

(12) United States Patent
Nakagawa et al.

(10) Patent No.: US 12,124,143 B2
(45) Date of Patent: Oct. 22, 2024

(54) DISPLAY PANEL

(71) Applicant: Sharp Display Technology Corporation, Kameyama (JP)

(72) Inventors: Hidetoshi Nakagawa, Kameyama (JP); Yoshihisa Takahashi, Kameyama (JP); Masahiro Matsuda, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/373,896

(22) Filed: Sep. 27, 2023

(65) Prior Publication Data

US 2024/0134238 A1    Apr. 25, 2024
US 2024/0231166 A9    Jul. 11, 2024

(30) Foreign Application Priority Data

Oct. 20, 2022    (JP) ................. 2022-168439

(51) Int. Cl.
*G02F 1/1368* (2006.01)
*G02F 1/1362* (2006.01)
*H01L 27/12* (2006.01)
*G09G 3/36* (2006.01)

(52) U.S. Cl.
CPC ...... *G02F 1/1368* (2013.01); *G02F 1/136286* (2013.01); *H01L 27/124* (2013.01); *G02F 2201/50* (2013.01); *G09G 3/3677* (2013.01); *G09G 2310/0286* (2013.01); *G09G 2330/04* (2013.01)

(58) Field of Classification Search
CPC .................................................. G02F 1/1368
See application file for complete search history.

(56) References Cited

U.S. PATENT DOCUMENTS

| | | | |
|---|---|---|---|
| 2009/0091671 A1* | 4/2009 | Tsubata | G02F 1/136286 349/38 |
| 2012/0003895 A1* | 1/2012 | Min | H01J 31/127 977/843 |
| 2012/0229712 A1* | 9/2012 | Yoshida | G02F 1/1339 348/E3.016 |
| 2012/0327057 A1* | 12/2012 | Sakamoto | G11C 19/184 345/211 |
| 2017/0124977 A1* | 5/2017 | Suzuki | G09G 3/3677 |
| 2020/0193925 A1* | 6/2020 | Takahashi | G09G 3/3674 |
| 2021/0272949 A1* | 9/2021 | Nakagawa | H10K 59/131 |

FOREIGN PATENT DOCUMENTS

| WO | 2011/104945 A1 | 9/2011 |
|---|---|---|
| WO | 2018/025412 A1 | 2/2018 |

\* cited by examiner

*Primary Examiner* — Sang V Nguyen
(74) *Attorney, Agent, or Firm* — ScienBiziP, P.C.

(57) ABSTRACT

A display panel includes a display region and a peripheral region other than the display region. The display panel includes, in the peripheral region, a gate drive circuit and a first trunk line extending in a column direction. The first trunk line includes a first edge on a first side corresponding to the display region side in the row direction and a second edge on a second side corresponding to a side opposite to the display region in the row direction. The first trunk line includes a first portion and a second portion, each including the first edge and the second edge, and the first edge of the second portion is closer to the second side in the row direction than the first edge of the first portion. The first portion is not provided with an element, and the second portion includes a region provided with an element.

11 Claims, 5 Drawing Sheets

DISPLAY PANEL

CROSS-REFERENCE TO RELATED APPLICATIONS

This application claims the benefit of priority to Japanese Patent Application Number 2022-168439 filed on Oct. 20, 2022. The entire contents of the above-identified application are hereby incorporated by reference.

BACKGROUND

Technical Field

The disclosure relates to a display panel.

Liquid crystal display panels are used in liquid crystal display devices for various applications, such as mobile terminal and television applications. Frame narrowing of a liquid crystal display panel is required from the viewpoint of reducing manufacturing costs and from the viewpoint of designability and functionality. By using a gate driver monolithic (GDM) technique in which a gate drive circuit (also referred to as a "gate driver") is integrally formed on a TFT substrate, it is possible to reduce the cost for driver mounting and narrow the frame as compared to a case in which the gate drive circuit is mounted on the TFT substrate using chip on film (COF), chip on glass (COG), or the like. This GDM technique is sometimes referred to as gate on array (GOA).

WO 2011/104945, WO 2018/025412, and US 2021/272,949 disclose display devices to which the GDM technique is applied. In the display devices disclosed in WO 2011/104945, WO 2018/025412, and US 2021/272,949, a gate drive circuit and a trunk line group extending in a vertical direction and configured to supply signals to the gate drive circuit are provided in a region on the TFT substrate of the display panel corresponding to a region other than the display region of the display device (also referred to as a "peripheral region" or a "frame region"), that is, for example, a region on the left side and/or the right side of the display region.

SUMMARY

Improvement of the manufacturing yield of a display device to which a GDM technique is applied is in demand. As a factor that reduces the manufacturing yield, there is, for example, breakdown due to electrostatic discharge (ESD) in the manufacturing process of the display panel. Details will be described below.

An object of the disclosure is to provide a display panel in which the occurrence of a defect caused by ESD is suppressed.

According to embodiments of the disclosure, solutions described in the following items are provided.

Item 1

A display panel includes a plurality of pixels arrayed in a matrix shape including a plurality of pixel rows and a plurality of pixel columns, a display region defined by the plurality of pixels, a peripheral region other than the display region, a gate drive circuit provided in the peripheral region and including a shift register including a plurality of stages respectively associated with the plurality of pixel rows, and a first trunk line provided in the peripheral region and extending in a column direction. The first trunk line includes, as edges on both sides of the first trunk line in a row direction, a first edge on a first side corresponding to the display region side in the row direction and a second edge on a second side corresponding to a side opposite to the display region in the row direction. The first trunk line includes a first portion and a second portion, each including the first edge and the second edge. The first edge of the second portion is closer to the second side in the row direction than the first edge of the first portion. The first portion is not provided with an element, and the second portion includes a region provided with an element.

Item 2

The display panel according to item 1 further includes a second trunk line provided in the peripheral region, extending in the column direction, and positioned on a side of the first trunk line opposite to the display region. The first trunk line supplies a common signal to one or more first type stages included in the plurality of stages of the shift register. The second trunk line supplies another common signal to one or more second type stages included in the plurality of stages of the shift register. The second trunk line includes, as edges on both sides of the second trunk line in the row direction, a third edge on the display region side and a fourth edge on the side opposite to the display region. The second trunk line includes a third portion adjacent to the first portion of the first trunk line in the row direction and including the third edge and the fourth edge, and a fourth portion adjacent to the second portion of the first trunk line in the row direction and including the third edge and the fourth edge. The third portion includes a region provided with an element. The fourth portion is not provided with an element. The first trunk line supplies the common signal to the one or more first type stages via the element provided in the second portion. The second trunk line supplies the another common signal to the one or more second type stages via the element provided in the third portion.

Item 3

In the display panel according to item 2, the second portion of the first trunk line is disposed in a formation region of one or more unit circuits respectively constituting the one or more first type stages, and the third portion of the second trunk line is disposed in a formation region of one or more unit circuits respectively constituting the one or more second type stages.

Item 4

In the display panel according to item 2 or 3, a shape of the third edge of the second trunk line matches a shape of the second edge of the first trunk line, and a distance between the third edge of the second trunk line and the second edge of the first trunk line is substantially constant.

Item 5

In the display panel according to any one of items 2 to 4, a width of the fourth portion of the second trunk line is smaller than a width of the third portion of the second trunk line.

Item 6

In the display panel according to any one of items 1 to 5, the first trunk line further includes a coupling portion configured to couple the first portion and the second portion, the first portion and the second portion extend in the column direction, and the coupling portion extends in a direction different from the column direction.

Item 7

In the display panel according to item 6, the first trunk line is bent between the first portion and the coupling portion and between the second portion and the coupling portion.

Item 8

In the display panel according to any one of items 1 to 7, the first trunk line includes a plurality of electrostatic discharge (ESD) sacrificial portions protruding toward the display region side.

Item 9

In the display panel according to item 8 citing item 7, the plurality of ESD sacrificial portions include an ESD sacrificial portion extending from a corner formed by the first portion and the coupling portion of the first trunk line toward the display region side.

Item 10

In the display panel according to item 8 or 9, the plurality of ESD sacrificial portions are provided correspondingly to the plurality of stages of the shift register.

Item 11

In the display panel according to any one of items 1 to 10, a width of the second portion of the first trunk line is equal to a width of the first portion of the first trunk line.

Item 12

The display panel according to any one of items 1 to 11 further includes a substrate, a gate metal layer formed on the substrate, an insulating layer covering the gate metal layer, and a source metal layer formed on the insulating layer. The first trunk line is included in the gate metal layer.

Item 13

In the display panel according to any one of items 1 to 12, the element is a thin film transistor (TFT) included in a unit circuit constituting the stage of the shift register.

According to an embodiment of the disclosure, provided is a display panel in which the occurrence of a defect caused by ESD is suppressed.

BRIEF DESCRIPTION OF DRAWINGS

The disclosure will be described with reference to the accompanying drawings, wherein like numbers reference like elements.

FIG. 2 is a schematic plan view of the display device 1100a.

FIG. 3 is a schematic plan view of the display panel 1000a, and is a plan view schematically illustrating a portion of the display panel 1000a.

DESCRIPTION OF EMBODIMENTS

Hereinafter, embodiments of the disclosure will be described with reference to the accompanying drawings. Note that, although a liquid crystal display panel will be described below as an example of a display panel according to embodiments of the disclosure, the disclosure is not limited to the following embodiments. In the following drawings, constituent elements having substantially the same functions may be denoted by common reference signs, and description thereof may be omitted.

First Embodiment

Figure 1:
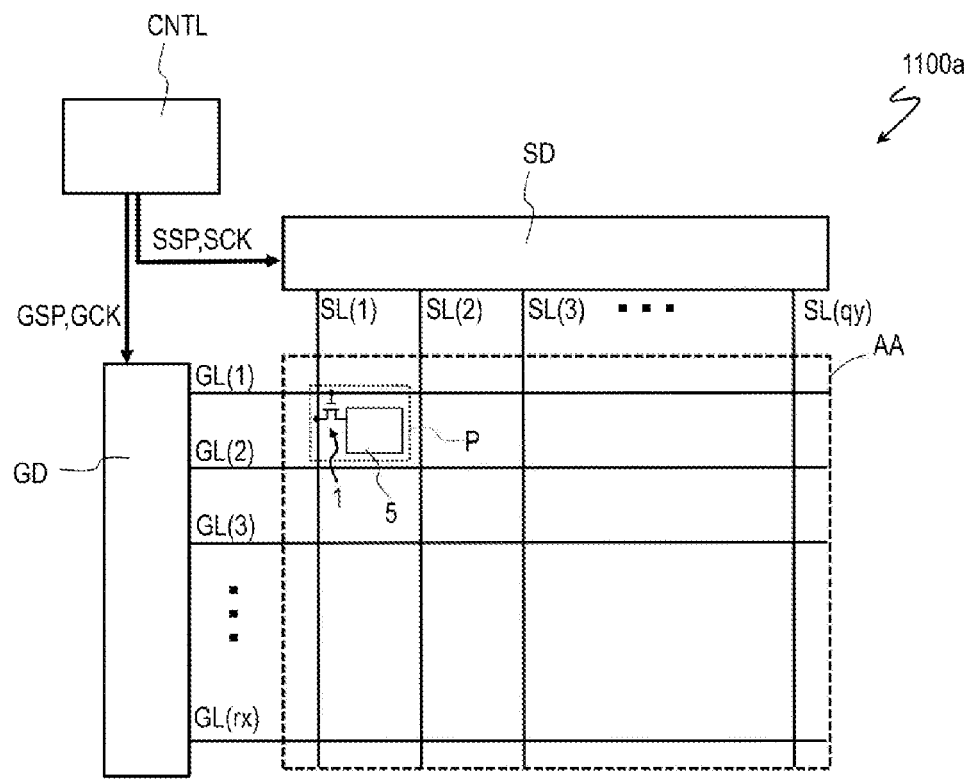
FIG. 1 is a schematic diagram illustrating a configuration of a display device 1100a including a display panel 1000a according to a first embodiment of the disclosure.
Figure 2:
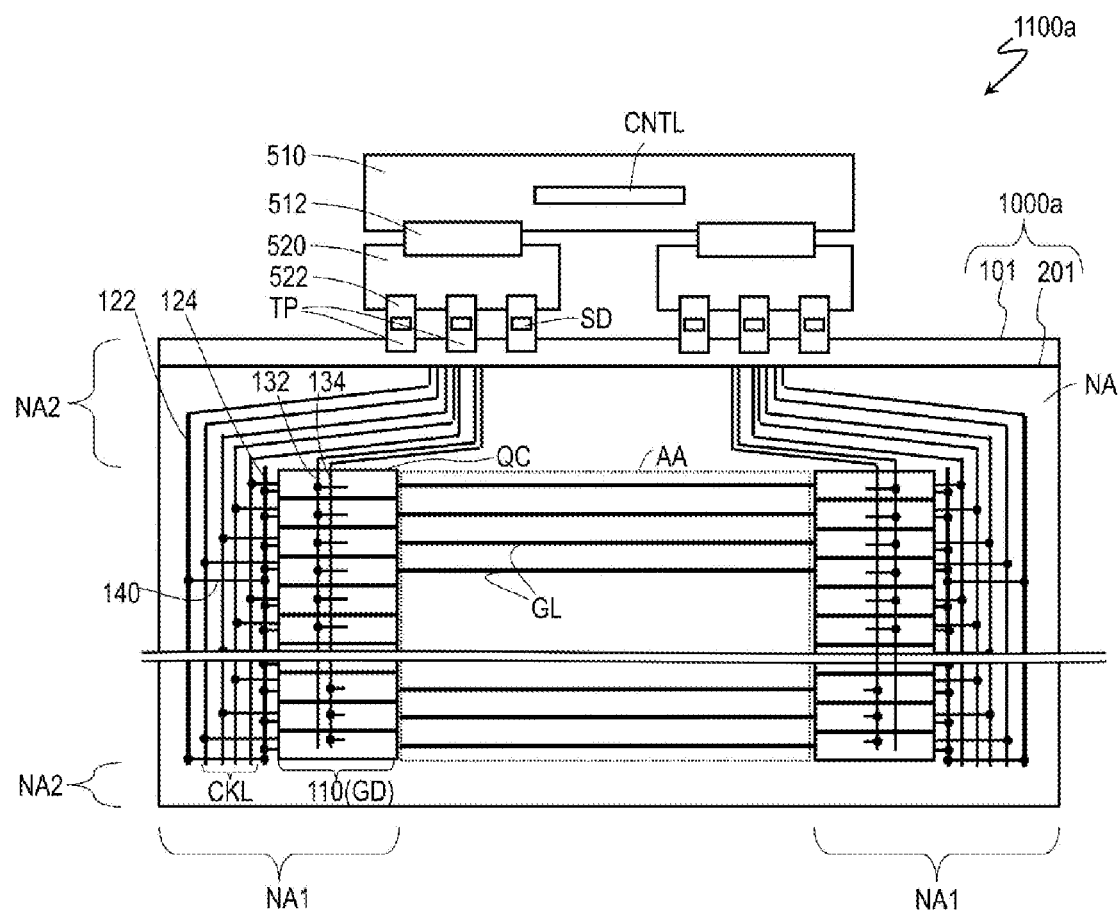
Figure 2:
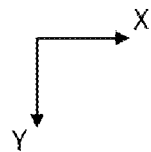
Figure 3:
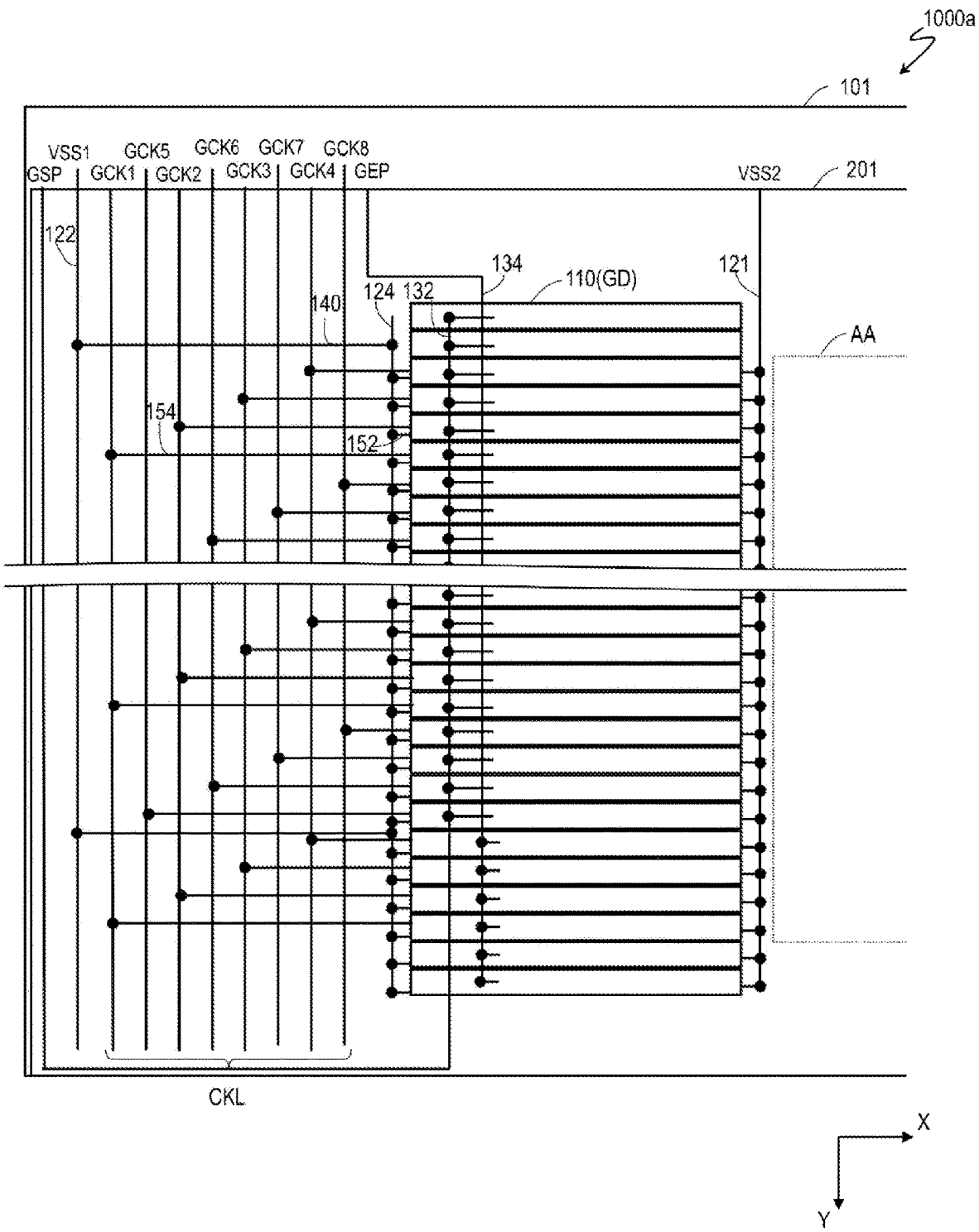
Figure 4:
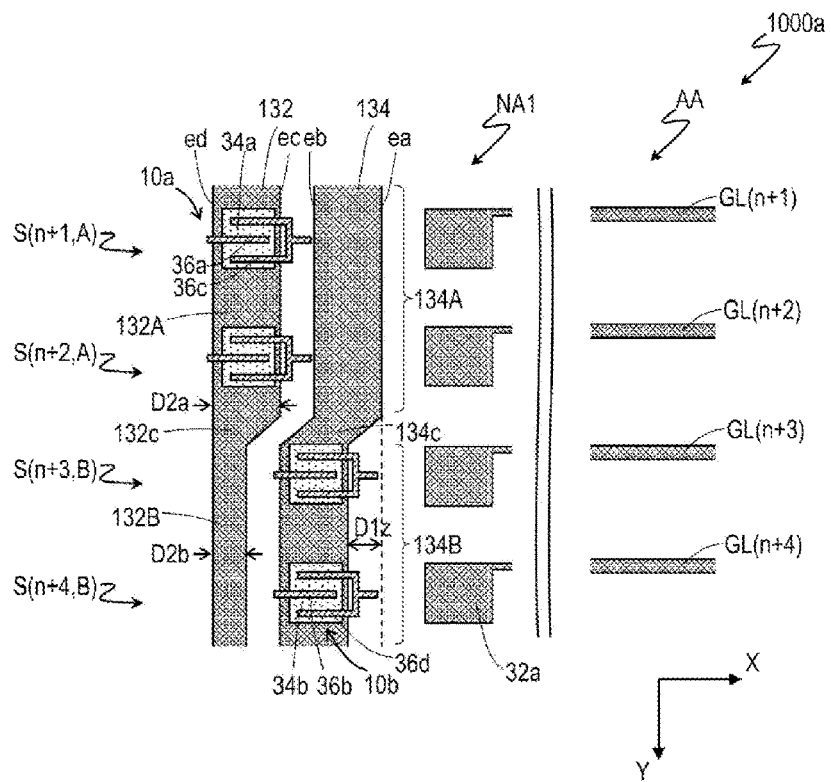
FIG. 4 is a schematic plan view of the display panel 1000a, and is a plan view schematically illustrating a portion of a peripheral region NA and a display region AA.

A liquid crystal display panel 1000a and a liquid crystal display device 1100a including the liquid crystal display panel 1000a (hereinafter also referred to as "display panel 1000a" and "display device 1100a") according to the present embodiment will be described with reference to FIGS. 1 to 4. FIG. 1 is a schematic view illustrating a configuration of the display device 1100a. FIG. 2 is a schematic plan view of the display device 1100a. FIG. 3 is a schematic plan view of the display panel 1000a, and is a plan view schematically illustrating a portion of the display panel 1000a. FIG. 4 is a schematic plan view of the display panel 1000a, and is a plan view schematically illustrating a portion of a peripheral region NA and a display region AA.

As illustrated in FIGS. 1 and 2, the display panel 1000a includes a plurality of pixels P arrayed in a matrix shape including a plurality of pixel rows and a plurality of pixel columns. Each pixel P is provided with a thin film transistor (TFT) 1 and a pixel electrode 5 electrically connected to the TFT. The pixel row is a plurality of the pixels P arrayed in a row direction (X direction in FIG. 2), and the pixel column is a plurality of the pixels P arrayed in a column direction (Y direction in FIG. 2). The display panel 1000a includes a TFT substrate 101 and a counter substrate 201 facing each other, and a liquid crystal layer provided between these substrates. The display panel 1000a includes a display region AA defined by the plurality of pixels P, and the peripheral region NA other than the display region AA. The peripheral region NA includes a first peripheral region NA1 outward of the display region AA in the row direction, and a second peripheral region NA2 outward of the display region AA in the column direction. The display device 1100a includes the display panel 1000a and a circuit substrate 510 connected to the display panel 1000a.

In this example, a gate bus line GL is associated with each of the plurality of pixel rows, and a source bus line SL is associated with each of the plurality of pixel columns. The TFT 1 of each pixel P is supplied with a gate signal from the corresponding gate bus line GL, and is supplied with a source signal from the corresponding source bus line SL. The pixel rows may be referred to as a first row, a second row, . . . , and an rx-th row in order from the top, and the gate bus line associated with the r-th pixel row ($1 \leq r \leq rx$) may be referred to as a gate bus line GL (r) (see FIG. 1). Here, rx is the number of pixel rows included in the display panel 1000a. The pixel in the r-th pixel row is selected by the scanning signal voltage supplied to the gate bus line GL (r). The gate bus line GL (r) associated with the r-th pixel row is connected to a gate electrode of the TFTs connected to the pixels included in the r-th pixel row. The pixel columns may be referred to as a first column, a second column, . . . , and a qy-th column in order from the left, and the source bus line SL associated with the q-th pixel column may be referred to as a source bus line SL (q). Here, qy is the number of pixel columns included in the display panel 1000a. A display signal voltage is supplied from the source bus line SL (q) to the pixels in the q-th pixel column ($1 \leq q \leq qy$). The source bus line SL (q) associated with the q-th pixel column is connected to a source electrode of the TFTs connected to the pixels included in the q-th pixel column.

The display panel 1000a includes a gate drive circuit GD. Herein, the gate drive circuit GD is integrally formed on the TFT substrate 101 (gate driver monolithic). The gate drive circuit GD is provided in the first peripheral region NA1 of the display panel 1000a and includes a shift register 110 provided with a plurality of stages respectively associated with the plurality of pixel rows. Outputs of each stage of the shift register 110 are connected to the gate bus lines GL respectively associated with the plurality of pixel rows. Typically, the shift register 110 includes rx stages and, given that the first stage, the second stage, . . . , and the rx-th stage are arranged in this order from the top, the output of the r-th stage (1≤r≤rx) is connected to the gate bus line GL (r). In addition to the rx stages, the shift register 110 may further include one or more dummy stages adjacent to the rx stages in the column direction and not contributing to display. The shift register 110 is configured by cascade-connecting a plurality of unit circuits QC. Each stage of the shift register 110 is configured by each unit circuit QC. The unit circuit QC constituting each stage of the shift register 110 includes at least one TFT (semiconductor element).

The display panel 1000a includes a first trunk line 134 provided in the peripheral region NA and extending in the column direction. The first trunk line 134 has a shape such as the following. The first trunk line 134 includes, among edges on both sides of the first trunk line 134 in the row direction, a first edge ea on the display region AA side and a second edge eb on the side opposite to the display region. In the row direction, the display region AA side may be referred to as a first side, and the other side opposite to the display region AA may be referred to as a second side. That is, the first edge ea is on the first side in the row direction, and the second edge eb is on the second side in the row direction. The first trunk line 134 includes a first portion 134A and a second portion 134B, each including the first edge ea and the second edge eb. The second portion 134B can be regarded as positioned in the column direction of the first portion 134A. In the present specification, the "column direction" includes a direction parallel to a +Y direction and a -Y direction unless otherwise specified. Here, the direction of the arrow of the Y axis in the drawing is referred to as the +Y direction, and the opposite direction is referred to as the -Y direction. Similarly, the "row direction" includes a direction parallel to a +X direction and a -X direction unless otherwise specified. Here, the direction of the arrow of the X axis in the drawing is referred to as the +X direction, and the opposite direction is referred to as the -X direction. In the illustrated example, in the peripheral region NA (FIGS. 3 and 4) on the left side of the display region AA, the first side in the row direction is the +X direction, and the second side in the row direction is the -X direction. In the peripheral region NA on the right side of the display region AA, the first side in the row direction is the -X direction, and the second side in the row direction is the +X direction. The first edge ea of the second portion 134B is farther on the second side in the row direction than the first edge ea of the first portion 134A. For example, the first edge ea of the second portion 134B is farther from the display region AA than the first edge ea of the first portion 134A. The first portion 134A is not provided with an element (here, a TFT included in the unit circuit QC). The second portion 134B includes a region provided with an element (here, a TFT 10b included in the unit circuit QC). The first portion 134A and the second portion 134B may not be continuous. In this example, the first trunk line 134 further includes a coupling portion 134c between the first portion 134A and the second portion 134B. The first trunk line 134 may include portions other than the first portion 134A, the second portion 134B, and the coupling portion 134c. Here, the TFT included in the unit circuit QC included in each of the plurality of stages of the shift register 110 is illustrated as an example of the element, but the element is not limited thereto and may be another circuit element (for example, a capacitance element).

The display panel 1000a further includes a second trunk line 132 provided in the peripheral region NA and extending in the column direction. The second trunk line 132 is positioned on the side of the first trunk line 134 opposite to the display region AA. That is, the first trunk line 134 is positioned between the display region AA and the second trunk line 132. The first trunk line 134 and the second trunk line 132 are used to supply a signal to each of the plurality of stages of the shift register 110. The first trunk line 134 supplies a common signal to one or more first type stages included in the plurality of stages. The second trunk line 132 supplies another common signal to one or more second type stages included in the plurality of stages. That is, among the plurality of stages included in the shift register 110, a stage supplied with a signal from the first trunk line 134 is referred to as a "first type stage", and a stage supplied with a signal from the second trunk line 132 is referred to as a "second type stage". The first trunk line 134 and the second trunk line 132 are electrically independent from each other, making it possible to supply signals different from each other to the first type stages and the second type stages. The first trunk line 134 and the second trunk line 132 are used to supply a clear signal (reset signal) to each stage of the shift register 110, for example. The gate start pulse signal GSP and/or the gate end pulse signal GEP may be used as the clear signal. For example, the gate end pulse signal GEP is supplied as the clear signal to the first type stage, and the gate start pulse signal GSP is supplied as the clear signal to the second type stage.

FIG. 4 illustrates an (n+1)th stage S(n+1) to an (n+4)th stage S(n+4) among the plurality of stages included in the shift register 110. The first number x in the parenthesis after the reference numeral of the stage S corresponds to the x-th stage of the shift register 110, and the letter ("A" or "B") following the number x in the parenthesis indicates whether the x-th stage is the first type stage or the second type stage, indicating "B" when the x-th stage is the first type stage and "A" when the x-th stage is the second type stage. The unit circuit constituting each of the (n+3)th stage and the (n+4)th stage, which are the first type stages, includes the TFT 10b, and the unit circuit constituting each of the (n+1)th stage and the (n+2)th stage, which are the second type stages, includes a TFT 10a. The second portion 134B of the first trunk line 134 includes a region provided with the TFT 10b, that is, includes a portion constituting the TFT 10b (for example, a portion functioning as a gate electrode of the TFT 10b). Comb-shaped electrodes formed by electrodes 36b, 36d are a source electrode and a drain electrode of the TFT 10b that uses the first trunk line 134 as the gate electrode. The first trunk line 134 supplies a common signal to the first type stage via the TFT 10b provided in the second portion 134B. The first portion 134A of the first trunk line 134 is disposed, for example, in a formation region of the unit circuit QC constituting the second type stage. Further, the second portion 134B of the first trunk line 134 is disposed, for example, in a formation region of the unit circuit QC constituting the first type stage. However, the first trunk line 134 may be provided farther on the second side (that is, the side opposite to the display region AA) in the row direction than the shift register 110. Further, a portion of the first trunk line 134 disposed in the formation region of the unit circuit QC constituting the first type stage may include a portion other than the second portion 134B (for example, a portion in which the position of the first edge ea in the row direction is the same as that of the first portion 134A or a portion in which the position of the first edge ea in the row direction changes (coupling portion 134c)). Similarly, the portion of the first trunk line 134 disposed in the formation region of the unit circuit QC constituting the second type stage may include a portion other than the first portion 134A.

The second trunk line 132 includes a third portion 132A adjacent to the first portion 134A of the first trunk line 134 in the row direction and including a third edge ec and a fourth edge ed, and a fourth portion 132B adjacent to the second portion 134B of the first trunk line 134 in the row direction and including the third edge ec and the fourth edge ed. The third portion 132A includes a region provided with the TFT 10a included in the unit circuit QC. That is, the third portion 132A includes a portion constituting the TFT 10a (for example, a portion functioning as a gate electrode of the TFT 10a). Comb-shaped electrodes formed by electrodes 36a, 36c are a source electrode and a drain electrode of the TFT 10a that uses the second trunk line 132 as the gate electrode. The fourth portion 132B is not provided with a TFT included in the unit circuit QC. The second trunk line 132 supplies another common signal to the second type stage via the TFT 10a provided in the third portion 132A. The third portion 132A of the second trunk line 132 is disposed, for example, in the formation region of the unit circuit QC constituting the second type stage. Further, the fourth portion 132B of the second trunk line 132 is disposed, for example, in the formation region of the unit circuit QC constituting the first type stage. However, the second trunk line 132 may be provided farther on the second side (that is, the side opposite to the display region AA) in the row direction than the shift register 110. Further, a portion of the second trunk line 132 disposed in the formation region of the unit circuit QC constituting the second type stage may include a portion other than the third portion 132A (for example, a portion in which the position of the third edge ec in the row direction is the same as that of the fourth portion 132B or a portion in which the position of the third edge ec in the row direction changes (coupling portion 132c)). Similarly, the portion of the second trunk line 132 disposed in the formation region of the unit circuit QC constituting the first type stage may include a portion other than the fourth portion 132B.

Figure 5:
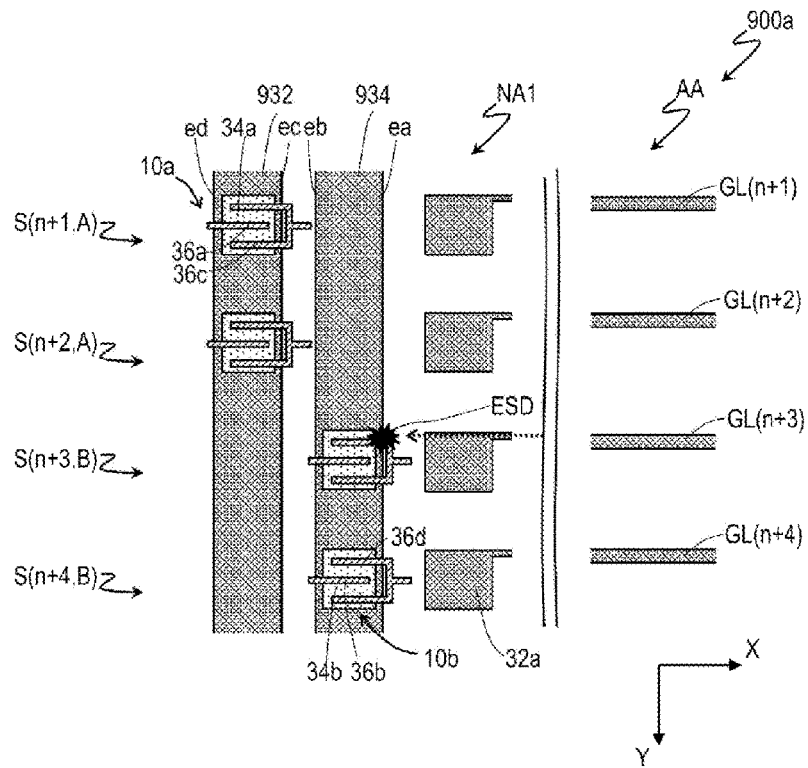
FIG. 5 is a schematic plan view of a display panel 900a of a comparative example, and is a plan view schematically illustrating a portion of the peripheral region NA and the display region AA.

The reason that the display panel 1000a can suppress the occurrence of a defect caused by ESD will now be described while comparing the display panel 1000a with a display panel of a comparative example. FIG. 5 is a schematic plan view of a display panel 900a of a comparative example, and corresponds to the schematic plan view of the display panel 1000a illustrated in FIG. 4. FIGS. 4 and 5 partially illustrate the first peripheral region NA1 disposed on the left side of the display region AA, and the display region AA. Hereinafter, the same applies to similar drawings. In the display panel 900a of the comparative example, the shapes of a first trunk line 934 and a second trunk line 932 differ from those of the first trunk line 134 and the second trunk line 132 of the display panel 1000a. According to a study by the present inventors, in the display panel 900a of the comparative example, it is not possible to sufficiently suppress defects caused by ESD.

An insulating layer (gate insulating layer) and a semiconductor layer (34a, 34b) are formed on a gate metal layer (first trunk line 134 or first trunk line 934, second trunk line 132 or second trunk line 932, conductive portion 32a), and a source metal layer (electrodes 36a, 36b, 36c, 36d) is formed thereon.

For example, in the process of forming TFTs on the TFT substrate 101 within the process of manufacturing the substrate, when a gate insulating film and a semiconductor film are formed and patterned after formation of the gate metal layer on the substrate, ESD may occur between the patterns on the gate metal layer. In particular, when the display panel is large, the area occupied by the gate metal (portion where a conductor actually exists) of the gate metal layer increases, increasing the amount of charge accumulated in the gate metal. The charge accumulated in the gate metal provided in the display region AA of the gate metal layer jumps outwardly from the display region AA side (that is, toward the peripheral region side), fusing the gate metal on the side receiving the charge and breaking the insulating film. When a source metal is formed on the fused portion in a subsequent process, a short circuit occurs on the fused portion. When the charge accumulated in the gate metal (gate bus line GL) provided in the display region AA jumps to the first trunk line 934 (dotted arrow in FIG. 5), a portion of the first trunk line 934 is fused and the insulating film is broken (ESD in FIG. 5). This ESD occurs between adjacent patterns of the gate metal layer when the gate insulating film and the semiconductor film are formed and patterned after the gate metal layer is formed (that is, after the gate metal film is deposited and patterned). The probability of occurrence of ESD tends to increase as a distance between the patterns of the gate metal layer decreases. When the source metal is formed on the fused portion of the gate metal in a subsequent process, a short circuit between the source metal and the gate metal (hereinafter referred to as an "S-G short circuit" for simplicity) occurs on the fused portion. The probability that ESD occurs between the first trunk line 934 and the conductive portion 32a is high, and thus an S-G short circuit is likely to occur in the TFT 10b formed overlapping the first trunk line 934. The conductive portion 32a is a portion of the gate metal, and is disposed in the vicinity of the first edge ea of the first trunk line 934. The conductive portion 32a is not electrically connected to the gate bus line GL. The charge accumulated in the gate bus line GL repeatedly jumps to the gate metal disposed in close proximity but not electrically connected to the gate bus line GL, and thus the conductive portion 32a can be a starting point of ESD to the first trunk line 934.

In contrast, the display panel 1000a according to the embodiment of the disclosure can suppress the occurrence of an S-G short circuit in the TFT 10b. In the display panel 1000a, the first edge ea of the second portion 134B of the first trunk line 134 is farther from the display region AA than the first edge ea of the first portion 134A, making it possible to suppress the S-G short circuit of the TFT 10b caused by ESD. The display panel 1000a can improve the manufacturing yield. FIG. 4 illustrates a difference D1z between a distance between the second portion 134B of the first trunk line 134 and the display region AA and a distance between the first portion 134A of the first trunk line 134 and the display region AA. In the display panel 1000a, the distance between the first trunk line 134 and the conductive portion 32a is longer by D1z compared to that of the display panel 900a of the comparative example, making it possible to suppress the probability of occurrence of ESD between the first trunk line 134 and the conductive portion 32a.

In this example, the first trunk line 134 further includes the coupling portion 134c coupling the first portion 134A and the second portion 134B. The first portion 134A and the second portion 134B extend in the column direction (Y direction in the drawing), and the coupling portion 134c coupling these portions extends in a direction different from the column direction. The first trunk line 134 is bent between the first portion 134A and the coupling portion 134c and between the second portion 134B and the coupling portion 134c. The widths of the first portion 134A of the first trunk line 134 and the second portion 134B of the first trunk line 134 may be, for example, equal to each other or may be different from each other. The shape of the first trunk line 134 is not limited to the example illustrated in the drawing, and only the difference D1z between the distance between the second portion 134B of the first trunk line 134 and the display region AA and the distance between the first portion 134A of the first trunk line 134 and the display region AA need be formed. For example, the first trunk line 134 may be smoothly curved between the second portion 134B and the first portion 134A. When the first trunk line 134 includes the coupling portion 134c, the second trunk line 132 further includes a coupling portion 132c adjacent to the coupling portion 134c of the first trunk line 134 in the row direction.

Among edges on both sides of the second trunk line 132 in the row direction, an edge on the display region AA side is referred to as a third edge ec, and an edge on the side opposite to the display region AA is referred to as a fourth edge ed. A shape of the third edge ec of the second trunk line 132 matches a shape of the second edge eb of the first trunk line 134. Accordingly, the third edge ec of the fourth portion 132B of the second trunk line 132 is farther from the display region AA than the third edge ec of the third portion 132A of the second trunk line 132. A distance between the third edge ec of the second trunk line 132 and the second edge eb of the first trunk line 134 is substantially constant. Here, the distance between the third edge ec of the second trunk line 132 and the second edge eb of the first trunk line 134 is assumed to be the same as the distance between the third edge ec of the second trunk line 932 and the second edge eb of the first trunk line 934 of the display panel 900a of the comparative example. A width D2b of the fourth portion 132B of the second trunk line 132 is smaller than a width D2a of the third portion 132A of the second trunk line 132. With the second trunk line 132 having such a shape, the display panel 1000a can suppress the occurrence of a defect caused by ESD while suppressing an increase in the area of the peripheral region NA (in particular, the first peripheral region NA1), that is, without sacrificing realization of frame narrowing of the display panel, as compared with the display panel 900a of the comparative example.

Structures of the display panel 1000a and the display device 1100a will now be described in more detail.

As illustrated in FIG. 2, the circuit substrate 510 includes a control circuit CNTL that supplies a control signal to the gate drive circuit GD. For example, the control circuit CNTL is mounted on the circuit substrate 510. The circuit substrate 510 is connected to a terminal portion TP formed in the second peripheral region NA2 of the display panel 1000a via a source substrate 520. The circuit substrate 510 is connected to the source substrate 520 via flexible printed circuits (FPCs) 512. The terminal portion TP is provided with a terminal electrically connected to each trunk line for supplying a signal to the gate drive circuit GD. The circuit substrate 510 supplies, via the source substrate 520, a signal from the terminal portion TP of the display panel 1000a to each trunk line for supplying a signal to the gate drive circuit GD. In this example, the circuit substrate 510 is connected to the display panel 1000a via a plurality of the source substrates 520. Each of the source substrates 520 (printed wiring boards) is connected to the display panel 1000a via a plurality of the flexible circuit boards 522, and source drive circuits SD for supplying a display signal voltage to the source bus lines SL are mounted on the flexible circuit boards 522. Note that, in FIG. 2, the source bus lines SL are not illustrated for ease of understanding. The control circuit CNTL also supplies control signals to the source drive circuits SD, for example. The control signals supplied from the control circuit CNTL to the gate drive circuit GD include, for example, a gate start pulse signal GSP, a gate clock signal GCK, and a gate end pulse signal GEP. The control signals supplied from the control circuit CNTL to the source drive circuits SD include, for example, a source start pulse signal SSP and a source clock signal SCK. Note that the arrangement and connection method of the source drive circuits SD and the control circuit CNTL are not limited to those illustrated in the drawing. Further, although the gate drive circuit GD and the wiring lines for supplying signals to the gate drive circuit GD are provided on both the left and right sides of the display region AA in FIG. 2, the gate drive circuit GD and the wiring lines for supplying signals to the gate drive circuit GD may be provided on only one of the left and right sides of the display region AA.

FIG. 3 illustrates the wiring lines for inputting signals to the shift register 110 in more detail. The display panel 1000a further includes the following wiring lines provided in the first peripheral region NA1 for supplying signals to the gate drive circuit GD. Specifically, the display panel 1000a includes n clock trunk lines CKL1 to CKLn, each extending in the column direction and supplying n types (where n is an integer of 2 or greater) of clock signals having phases different from each other to the plurality of stages of the shift register 110, an outer trunk line 122 and an inner trunk line 124, each extending in the column direction and supplying a common signal to the plurality of stages of the shift register 110, and a plurality of branch wiring lines 140, each electrically connecting the outer trunk line 122 and the inner trunk line 124. The terminal portions TP in the second peripheral region NA2 of the display panel 1000a are provided with terminals (n clock trunk line terminals and n outer trunk line terminals) electrically connected to the n clock trunk lines CKL1 to CKLn and the outer trunk line 122, respectively. The n clock trunk lines CKL1 to CKLn may be collectively referred to as clock trunk lines CKL.

In the example of FIG. 3, eight clock trunk lines CKL1 to CKL8 are provided as the n clock trunk lines CKL1 to CKLn (n=8). Given that the gate clock signals GCK supplied from the clock trunk lines CKL1 to CKL8 are GCK1 to GCK8, the gate clock signals GCK1 to GCK8 are, for example, oscillating voltages having a cycle of 8H (1H is one horizontal scanning period) and a duty ratio of 1:1 (of the 8Hs of one cycle, 4Hs are at high level, and 4Hs are at low level), and the phases differ for each 1H. For example, a low-level potential Vg1 is −7 V and a high-level potential Vgh is 35 V. The terminal portions TP in the second peripheral region NA2 of the display panel 1000a are provided with terminals (eight clock trunk line terminals) electrically connected to the clock trunk lines CKL1 to CKL8, respectively, and the control circuit CNTL respectively supplies the gate clock signals GCK1 to GCK8 to the clock trunk lines CKL1 to CKL8 connected via the clock trunk line terminals. The clock trunk lines CKL1 to CKL8 and the inputs (input terminals) of the stages of the shift register 110 are electrically connected to each other via wiring lines 154 extending in the row direction, and thus the gate clock signals GCK1 to GCK8 are supplied to the inputs of the stages of the shift register 110. An example of a connection relationship between the input of each stage of the shift register 110 and the n clock trunk lines CKL1 to CKLn is as follows. For example, the inputs of the first to eighth stages are supplied with the gate clock signals GCK1 to GCK8 from the clock trunk lines CKL1 to CKL8, respectively, the inputs of the ninth to 16th stages are supplied with the gate clock signals GCK1 to GCK8 from the clock trunk lines CKL1 to CKL8, respectively, the inputs of the 17th to 24th stages are supplied with the gate clock signals GCK1 to GCK8 from the clock trunk lines CKL1 to CKL8, respectively, and so on. That is, the input of the {(a×n)+k}-th stage of the shift register 110 is supplied with the gate clock signal GCKk from the clock trunk line CKLk (where a is an integer of 0 or greater, and k is an integer from 0 to n−1).

The outer trunk line 122 and the inner trunk line 124 are for supplying, for example, a signal for applying a low-level potential (for example, VSS=−7 V) to the plurality of stages of the shift register 110. A signal for applying a fixed potential (for example, a signal for applying the low-level potential VSS) is supplied from the control circuit CNTL to the outer trunk line 122 connected via the outer trunk line terminal. With the outer trunk line 122 and the inner trunk line 124 being electrically connected via the branch wiring lines 140, and the inner trunk line 124 and the input (input terminal) of each stage of the shift register 110 being electrically connected via the wiring line 152, a signal for applying the low-level potential VSS is supplied to the input of each stage of the shift register 110.

The display panel 1000a may further include an additional trunk line 121 provided in the first peripheral region NA1, extending in the column direction, and supplying another common signal to the plurality of stages of the shift register 110. In this case, signals for applying two kinds of low-level potentials (for example, VSS1=−12 V and VSS2=−7 V) are supplied from the control circuit CNTL. The outer trunk line 122 and the inner trunk line 124 supply signals for applying the low-level potential VSS2 to the plurality of stages of the shift register 110, and the trunk line 121 supplies a signal for applying the low-level potential VSS1 to the plurality of stages of the shift register 110.

Note that the outer trunk line 122 and the inner trunk line 124 may be for supplying, for example, a signal VD for applying a high-level potential (which may be different from Vgh) to the plurality of stages of the shift register 110. The signal VD for applying a high-level potential may be supplied from the control circuit CNTL to the outer trunk line 122 connected via the outer trunk line terminal.

In this example, the inner trunk line 124 is disposed farther from the display region AA than the shift register 110, and the outer trunk line 122 is disposed farther from the display region AA than the inner trunk line 124. The eight clock trunk lines CKL1 to CKL8 are provided between the outer trunk line 122 and the inner trunk line 124. A width of the outer trunk line 122 in the row direction is typically larger than a width of the inner trunk line 124 in the row direction.

Second Embodiment

Figure 6:
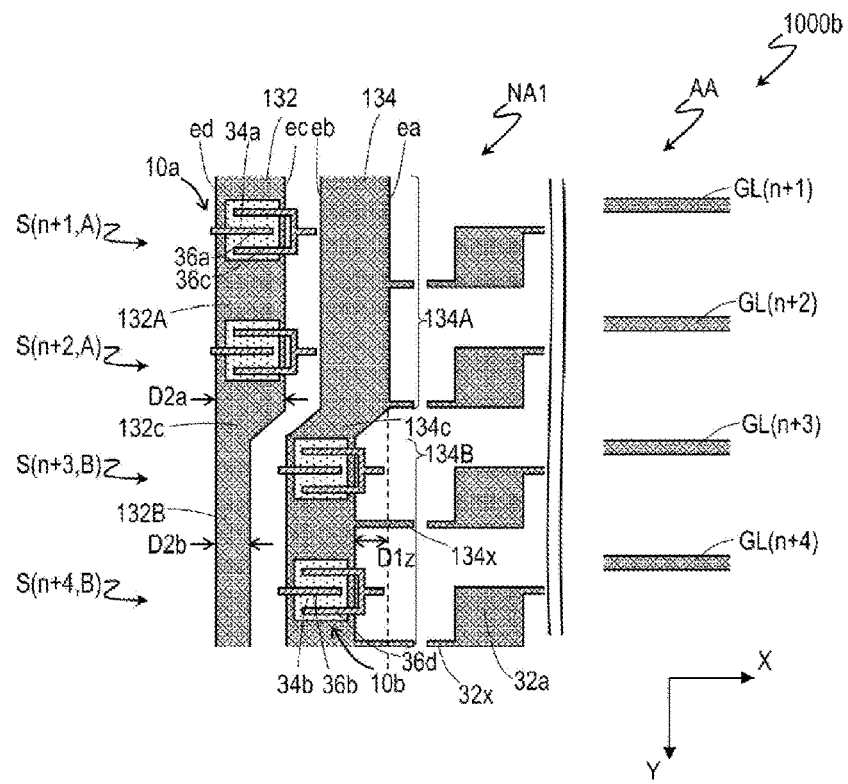
FIG. 6 is a schematic plan view of a display panel 1000b according to a second embodiment of the disclosure, and is a plan view schematically illustrating a portion of the peripheral region NA and the display region AA.

A display panel 1000b according to the present embodiment will now be described with reference to FIG. 6. FIG. 6 is a schematic plan view of the display panel 1000b, and is a plan view schematically illustrating a portion of the peripheral region NA and the display region AA. FIG. 6 is a view corresponding to the schematic plan view of the display panel 1000a illustrated in FIG. 4. The following mainly describes differences from the previous embodiment.

In the display panel 1000b, the first trunk line 134 includes a plurality of ESD sacrificial portions 134x protruding toward the display region AA side. The plurality of ESD sacrificial portions 134x are provided correspondingly to each stage of the shift register 110, for example. The "ESD sacrificial portion" is an additional portion not necessary for a wiring line or an electrode to perform its function, and is provided at a position where an ESD defect is more likely to occur compared to a portion (wiring line main body or electrode main body) necessary for the wiring line or the electrode to perform its function.

Figure 7:
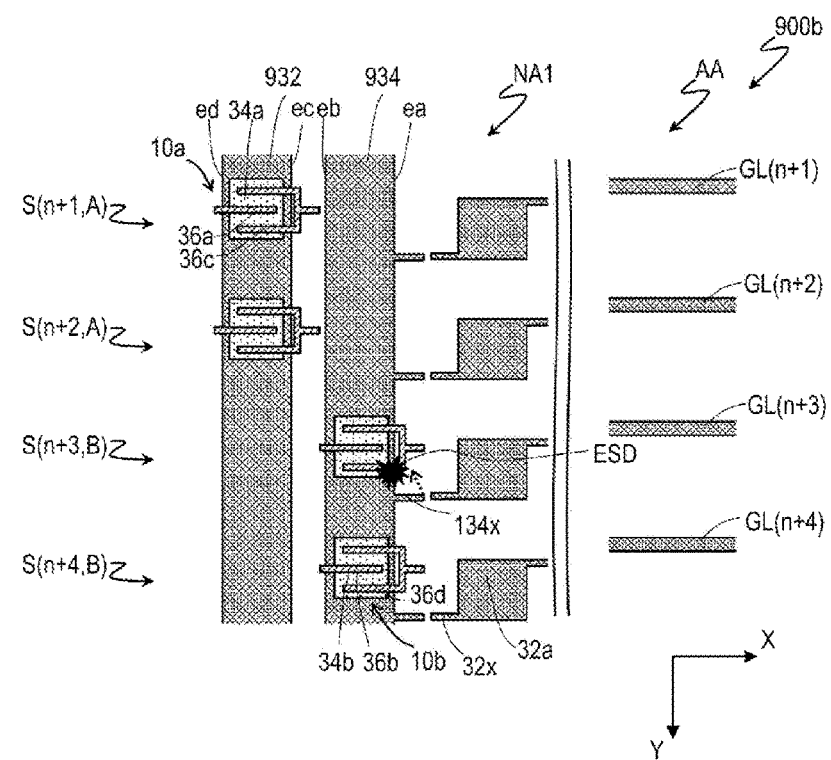
FIG. 7 is a schematic plan view of a display panel 900b of a comparative example, and is a schematic plan view schematically illustrating a portion of the peripheral region NA and the display region AA.

The display panel 1000b can suppress the occurrence of a defect caused by ESD, similarly to the display panel 1000a. The display panel 1000b will now be described while comparing the display panel 1000b with a display panel 900b of a comparative example. FIG. 7 is a schematic plan view of the display panel 900b of a comparative example, and is a schematic plan view schematically illustrating a portion of the peripheral region NA and the display region AA. In the display panel 900b of the comparative example, the shapes of the first trunk line 934 and the second trunk line 932 differ from those of the first trunk line 134 and the second trunk line 132 of the display panel 1000b.

A plurality of ESD sacrificial portions 32x are also provided on the first trunk line 934 side (side opposite to the display region AA side) of the conductive portion 32a so as to face the plurality of ESD sacrificial portions 134x provided on the first trunk line 934. The ESD sacrificial portions 134x of the first trunk line 934 and the ESD sacrificial portions 32x of the conductive portion 32a are in close proximity to each other, resulting in a high possibility that ESD occurs therebetween. That is, the charge accumulated in the gate metal provided in the display region AA is highly likely to jump to the ESD sacrificial portion 134x of the first trunk line 934. According to a study by the present inventors, when a charge that jumped to the ESD sacrificial portion 134x of the first trunk line 934 further jumps to a portion of the TFT 10b of the first trunk line 934 functioning as the gate electrode, a portion of the first trunk line 934 may be fused and the insulating film may break (ESD in FIG. 7). When the source metal is formed on the fused portion of the gate metal in a subsequent process, an S-G short circuit occurs on the fused portion. In this way, an S-G short circuit may occur in the TFT 10b.

In contrast, in the display panel 1000b, the first edge ea of the second portion 134B of the first trunk line 134 is farther from the display region AA than the first edge ea of the first portion 134A. Accordingly, a distance from a tip of the ESD sacrificial portion 134x provided in the first trunk line 134 to the TFT 10b is long, making it possible to suppress the S-G short circuit of the TFT 10b. Preferably, the ESD sacrificial portion 134x provided in the first portion 134A of the first trunk line 134 and the ESD sacrificial portion 134x provided in the second portion 134B of the first trunk line 134 have the same distance from the tips thereof to the display region AA.

For example, when the display panel is large, the area occupied by the first trunk line 134 in the gate metal of the gate metal layer is large, and thus a charge is also accumulated in the first trunk line 134, which may be one of the factors causing ESD. To suppress the charge from jumping from a corner formed by the first portion 134A of the first trunk line 134 and the coupling portion 134c, preferably the plurality of ESD sacrificial portions 134x include an ESD sacrificial portion 134x extending from a corner formed by the first portion 134A of the first trunk line 134 and the coupling portion 134c to the display region AA side.

The display panel according to the embodiments of the disclosure is widely applied to active matrix display panels such as a liquid crystal display panel and an organic EL display panel. When the display panel according to the embodiment of the disclosure is applied, the manufacturing yield of the active matrix display panel can be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A display panel comprising:
a plurality of pixels arrayed in a matrix shape including a plurality of pixel rows and a plurality of pixel columns;
a display region defined by the plurality of pixels;
a peripheral region other than the display region;
a gate drive circuit provided in the peripheral region and including a shift register including a plurality of stages respectively associated with the plurality of pixel rows;
a first trunk line provided in the peripheral region and extending in a column direction; and
a second trunk line provided in the peripheral region, extending in the column direction, and positioned on a side of the first trunk line opposite to the display region,
wherein the first trunk line includes, as edges on both sides of the first trunk line in a row direction, a first edge on a first side corresponding to the display region side in the row direction and a second edge on a second side corresponding to a side opposite to the display region in the row direction,
the first trunk line includes a first portion and a second portion, each including the first edge and the second edge,
the first edge of the second portion is closer to the second side in the row direction than the first edge of the first portion,
the first portion is not provided with an element,
the second portion includes a region provided with an element,
the first trunk line supplies a common signal to one or more first type stages included in the plurality of stages of the shift register,
the second trunk line supplies another common signal to one or more second type stages included in the plurality of stages of the shift register,
the second trunk line includes, as edges on both sides of the second trunk line in the row direction, a third edge on the display region side and a fourth edge on the side opposite to the display region,
the second trunk line includes a third portion adjacent to the first portion of the first trunk line in the row direction and including the third edge and the fourth edge, and a fourth portion adjacent to the second portion of the first trunk line in the row direction and including the third edge and the fourth edge,
the third portion includes a region provided with an element,
the fourth portion is not provided with an element,
the first trunk line supplies the common signal to the one or more first type stages via the element provided in the second portion, and
the second trunk line supplies the another common signal to the one or more second type stages via the element provided in the third portion.

2. The display panel according to claim 1,
wherein the second portion of the first trunk line is disposed in a formation region of one or more unit circuits respectively constituting the one or more first type stages, and
the third portion of the second trunk line is disposed in a formation region of one or more unit circuits respectively constituting the one or more second type stages.

3. The display panel according to claim 1,
wherein a shape of the third edge of the second trunk line matches a shape of the second edge of the first trunk line, and
a distance between the third edge of the second trunk line and the second edge of the first trunk line is substantially constant.

4. The display panel according to claim 3,
wherein a width of the fourth portion of the second trunk line is smaller than a width of the third portion of the second trunk line.

5. The display panel according to claim 1,
wherein the first trunk line further includes a coupling portion configured to couple the first portion and the second portion,
the first portion and the second portion extend in the column direction, and
the coupling portion extends in a direction different from the column direction.

6. The display panel according to claim 5,
wherein the first trunk line is bent between the first portion and the coupling portion and between the second portion and the coupling portion.

7. The display panel according to claim 6,
wherein the first trunk line includes a plurality of electrostatic discharge (ESD) sacrificial portions protruding toward the display region side.

8. The display panel according to claim 7,
wherein the plurality of ESD sacrificial portions includes an ESD sacrificial portion extending from a corner formed by the first portion and the coupling portion of the first trunk line toward the display region side.

9. A display panel comprising:
a plurality of pixels arrayed in a matrix shape including a plurality of pixel rows and a plurality of pixel columns;
a display region defined by the plurality of pixels;
a peripheral region other than the display region;
a gate drive circuit provided in the peripheral region and including a shift register including a plurality of stages respectively associated with the plurality of pixel rows; and
a first trunk line provided in the peripheral region and extending in a column direction,
wherein the first trunk line includes, as edges on both sides of the first trunk line in a row direction, a first edge on a first side corresponding to the display region side in the row direction and a second edge on a second side corresponding to a side opposite to the display region in the row direction,
the first trunk line includes a first portion and a second portion, each including the first edge and the second edge,
the first edge of the second portion is closer to the second side in the row direction than the first edge of the first portion, the first portion is not provided with an element, the second portion includes a region provided with an element, the first trunk line further includes a coupling portion configured to couple the first portion and the second portion, the first portion and the second portion extend in the column direction, the coupling portion extends in a direction different from the column direction, the first trunk line is bent between the first portion and the coupling portion and between the second portion and the coupling portion, the first trunk line includes a plurality of electrostatic discharge (ESD) sacrificial portions protruding toward the display region side, and the plurality of ESD sacrificial portions is provided correspondingly to the plurality of stages of the shift register.

10. The display panel according to claim 1, wherein a width of the second portion of the first trunk line is equal to a width of the first portion of the first trunk line.

11. The display panel according to claim 1, further comprising:
a substrate;
a gate metal layer formed on the substrate;
an insulating layer covering the gate metal layer; and
a source metal layer formed on the insulating layer,
wherein the first trunk line is included in the gate metal layer.

* * * * *